United States Patent
Lee et al.

(10) Patent No.: US 7,259,078 B2
(45) Date of Patent: Aug. 21, 2007

(54) METHOD FOR FORMING ISOLATION LAYER IN SEMICONDUCTOR MEMORY DEVICE

(75) Inventors: Seung Cheol Lee, Ichon-Shi (KR); Sang Wook Park, Seoul (KR); Pil Geun Song, Seoul (KR)

(73) Assignee: Hynix Semiconductor Inc., Kyungki-do (KR)

(*) Notice: Subject to any disclaimer, the term of this patent is extended or adjusted under 35 U.S.C. 154(b) by 198 days.

(21) Appl. No.: 11/016,437

(22) Filed: Dec. 17, 2004

(65) Prior Publication Data
US 2006/0051930 A1 Mar. 9, 2006

(30) Foreign Application Priority Data
Sep. 3, 2004 (KR) ............ 10-2004-0070229

(51) Int. Cl.
*H01L 21/76* (2006.01)
(52) U.S. Cl. .......... 438/424; 438/427; 438/435; 438/756
(58) Field of Classification Search .......... None
See application file for complete search history.

(56) References Cited

U.S. PATENT DOCUMENTS

| | | | |
|---|---|---|---|
| 6,225,167 B1 * | 5/2001 | Yu et al. | 438/275 |
| 6,642,105 B2 * | 11/2003 | Kim et al. | 438/257 |
| 6,737,359 B1 * | 5/2004 | Yang et al. | 438/745 |
| 6,864,148 B1 * | 3/2005 | Hsiao et al. | 438/400 |
| 6,884,682 B2 * | 4/2005 | Lee | 438/258 |
| 6,939,810 B2 * | 9/2005 | Sawamura | 438/723 |
| 7,091,104 B2 * | 8/2006 | Kim et al. | 438/424 |
| 2003/0119256 A1 * | 6/2003 | Dong et al. | 438/257 |
| 2003/0119260 A1 * | 6/2003 | Kim et al. | 438/257 |
| 2004/0145020 A1 * | 7/2004 | Kang et al. | 257/350 |

FOREIGN PATENT DOCUMENTS

CN 1400648 A 3/2003

OTHER PUBLICATIONS

An official action in China for Chinese Patent Application No. 200510005778.2 and English translation.

* cited by examiner

*Primary Examiner*—Zandra V. Smith
*Assistant Examiner*—Khanh Duong
(74) *Attorney, Agent, or Firm*—Marshall, Gerstein & Borun LLP

(57) ABSTRACT

Disclosed herein is a method for forming an isolation film of a semiconductor memory device. According to the disclosure, in a pre-treatment cleaning process performed before a tunnel oxide film is formed, a SC-1 cleaning process is performed at a temperature ranging from 60° C. to 70° C. Therefore, oxide films in a cell region and a peripheral region are recessed even in the SC-1 cleaning process as well as a DHF cleaning process. A DHF cleaning time can be thus reduced. Accordingly, the method can minimize loss of a silicon substrate by DHF and can thus control the depth of a moat.

20 Claims, 4 Drawing Sheets

METHOD FOR FORMING ISOLATION LAYER IN SEMICONDUCTOR MEMORY DEVICE

BACKGROUND OF THE DISCLOSURE

1. Field of the Disclosure

The disclosure generally relates to a method for forming an isolation film of a semiconductor memory device. More specifically, the disclosure relates to a method of forming an isolation film of a semiconductor memory device in which, when a process of forming the isolation film of the semiconductor memory device using Shallow Trench Isolation (STI) is performed, a cleaning process time using a DHF solution, which is performed from a process of forming a trenches to the process of forming the isolation film, can be shortened to minimize the depth of a moat formed in the isolation film.

2. Brief Description of Related Technology

Generally, in memory devices such as a flash memory device, Shallow Trench Isolation (STI) is employed as an isolation film formation process. The STI has solved a problem that is generated in an existing LOCOS (LOCal Oxidation of Silicon) mode, e.g., a bird's beak phenomenon. Such a STI method includes forming a trench, depositing a High Density Plasma (HDP) oxide film so that the trenches is gap-filled, and then polishing the oxide film using a Chemical Mechanical Polishing (CMP) process to form an isolation film.

In the isolation film formation process using STI, however, a moat (or micro trench) in which an edge portion of the isolation film is sunken is generated. This moat is generated at the interface between the sidewall of the trenches and the HDP oxide film due to a cleaning process, which is repeatedly performed several times upon isolation film formation process using STI. It has been generally known that this moat is generated because the HDP oxide film is not sufficiently filled in that portion in terms of its structure and is thus relatively weak against a cleaning solution that is used during the cleaning process. This moat results in degraded operating characteristics of the semiconductor memory device. Particularly, in a NAND-type flash memory device, the moat has a great influence upon the threshold voltage of a cell, the leakage current, critical dimension of an active region and so on, which are electrical properties. It has recently becomes an important issue to control the depth of the moat.

Generally, in the case of a method for forming an isolation film of a Dynamic Random Access Memory (DRAM) device or a NAND flash memory device using STI, a cleaning process is performed approximately 10 to 15 times until the isolation film is formed after a trenches formation process. Usually, the cleaning process is performed using Diluted HF (DHF) and SC-1 $NH_4OH/H_2O_2/H_2O$) solution. In the case of the NAND-type flash memory device, a moat of about 150' in depth is formed by this repetitive cleaning process. Among this repetitive cleaning process, the cleaning process for stripping a pad oxide film of a cell region after the HDP oxide film is deposited is carried out in order to recess a gate oxide film of a high voltage region and a low voltage region being a peripheral region at a given thickness as well as the stripping of the pad oxide film. In this case, in order to recess the gate oxide film at a given thickness, a time taken to perform the cleaning process is increased that much and the depth of the moat becomes deep accordingly. This degrades device characteristics.

SUMMARY OF THE INVENTION

Disclosed herein is a method of forming an isolation film of a semiconductor memory device in which, when a process of forming the isolation film of the semiconductor memory device is performed, a time taken to perform a cleaning process using a DHF solution, which is performed from a process of forming a trenches to the process of forming the isolation film, is shortened thereby minimizing the depth of moats formed in the isolation film.

The method includes providing a semiconductor substrate in which a pad oxide film is formed, depositing a pad nitride film on the pad oxide film, etching the pad nitride film, the pad oxide film and some of the semiconductor substrate to form trenches, depositing an insulating film to bury the trenches, polishing the insulating film, stripping the pad nitride film, and performing a pre-treatment cleaning process using a DHF or BOE cleaning process or a SC-1 cleaning process to strip the pad oxide film, wherein the SC-1 cleaning process is performed within a temperature where the pad oxide film is recessed.

Additional features of the disclosed method may become apparent to those skilled in the art from a review of the following detailed description, taken in conjunction with the drawing figures and the appended claims.

BRIEF DESCRIPTION OF THE DRAWINGS

For a more complete understanding of the disclosure, reference should be made to the following detailed description and accompanying drawings wherein.

Figure 1:
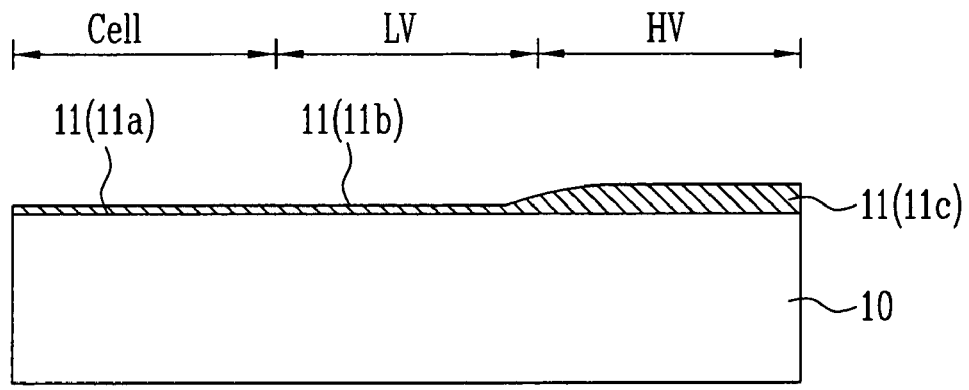
FIGS. 1 to 9 are cross-sectional views for explaining a method for forming an isolation film of a semiconductor memory device according to a preferred embodiment of the present invention.

While the disclosed method is susceptible of embodiments in various forms, there are illustrated in the drawing (and will hereafter be described) specific embodiments of the method, with the understanding that the disclosure is intended to be illustrative, and is not intended to limit the claimed invention to the specific embodiments described and illustrated herein

DETAILED DESCRIPTION OF THE INVENTION

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

FIGS. 1 to 9 are cross-sectional views for explaining a method for forming an isolation film of a semiconductor memory device according to a preferred embodiment of the present invention. For the sake of convenience, a process of forming an isolation film of a NAND-type flash memory device will be described as an example. A cell region is indicated by "Cell," a high voltage region is indicated by "HV" and a low voltage region is indicated by "LV."

Referring to FIG. 1, a semiconductor substrate 10 on which a pre-treatment cleaning process is performed is provided. In this time, the pre-treatment cleaning process can be performed by cleaning the semiconductor substrate using DHF (e.g., HF solution in which $H_2O$ is diluted in the ratio of 50:1) and then cleaning it using SC-1 (a solution in which $NH_4OH/H_2O_2/H_2O$ solution is mixed in a given ratio), or cleaning the semiconductor substrate using Buffer Oxide Etchant (BOE) (e.g., a mixing solution of HF and $NH_4F$ wherein $H_2O$ is diluted in the ratio of 100:1 or 300:1 (the ratio of HF and $NH_4F$ is 1:4 to 1:7)) and then cleaning it using SC-1. Thereafter, a screen oxide film (not shown) is formed on the semiconductor substrate 10. In this time, the screen oxide film is formed in order to prevent a well formed in a subsequent process and the surface of the semiconductor substrate 10 at the time of a threshold voltage ion implant process from being damaged. An ion implant process is then performed to form the well (not shown) in the semiconductor substrate 10. In this case, if the semiconductor substrate 10 is a p type substrate, the well can be composed of a TN-well (Triple N-well) and a P-well. The TN-well is formed by performing an ion implant process using phosphorus (P) and the P-well is formed by performing an ion implant process using boron (B).

Next, in order to form a channel, a threshold voltage ion implant process is performed on the semiconductor substrate 10. An oxide film 11 is then formed on the semiconductor substrate 10. In this time, the oxide film 11 is formed to be thicker in the high voltage region HV than in the cell region Cell and the low voltage region LV. For example, the method for forming the oxide film 11 will be described in short as follows. A wet oxidization process is first performed to thinly form an oxide film on the entire surface including the cell region Cell, the low voltage region LV and the high voltage region HV. A wet oxidization process using a mask the high voltage region HV of whish is opened is again performed to thickly form the oxide film 11 in the high voltage region HV. This oxide film 11 can be formed by performing the wet oxidization process at a temperature ranging from 750° C. to 800° C. and then performing an annealing process using $N_2$ at a temperature ranging from 900° C. to 910° C. Meanwhile, though it has not been described in the process steps for the sake of convenience, the cleaning process can be performed at least one times using DHF and SC-1 during the process of performing the process steps.

For the sake of convenience, hereinafter, the oxide film 11 formed in the cell region Cell will be referred to as a pad oxide film 11a, the oxide film 11 formed in the low voltage region LV will be referred to as a low voltage gate oxide film 11b, and the oxide film 11 formed in the high voltage region HV will be referred to as a high voltage gate oxide film 11c.

Figure 2:
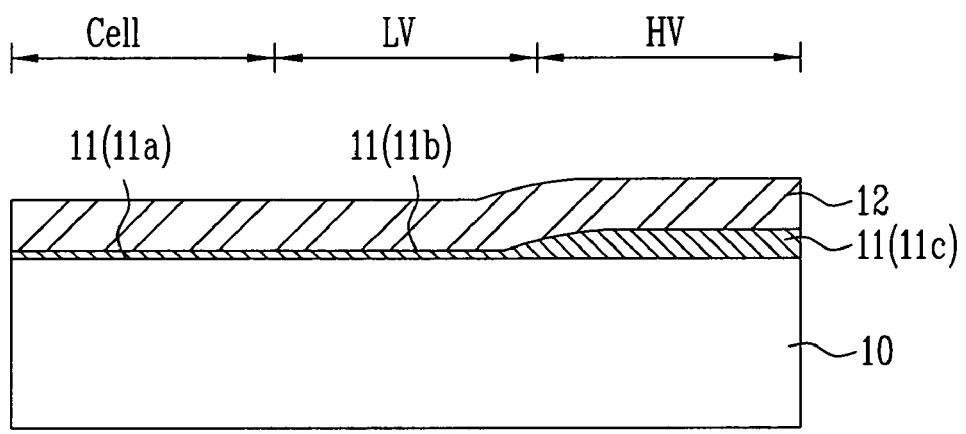

Referring to FIG. 2, a pad nitride film 12 is deposited on the entire surface including the pad oxide film 11a, the low voltage gate oxide film 11b and the high voltage gate oxide film 11c. In the time, the pad nitride film 12 can be deposited in a Low Pressure Chemical Vapor Deposition (LPCVD) mode.

Figure 3:
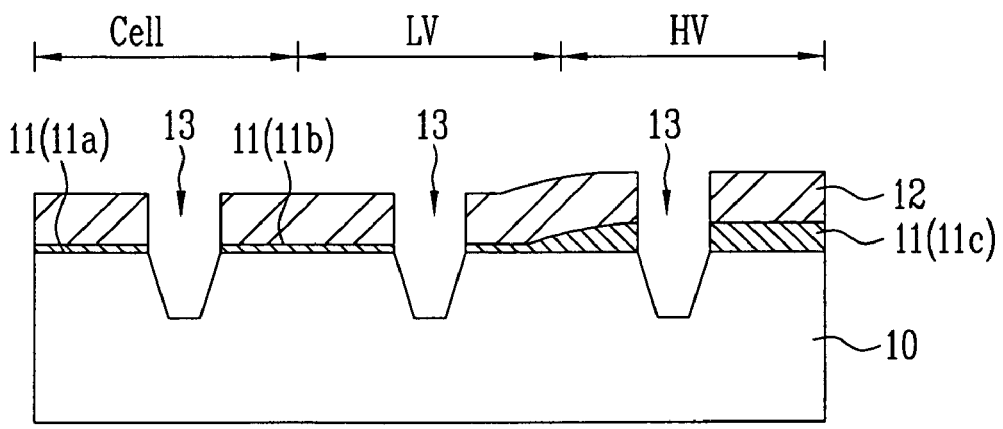

Referring to FIG. 3, after a photoresist is coated on the entire surface including the pad nitride film 12, an exposure process and a development process using a photo mask are sequentially performed to form a photoresist pattern (not shown). An etching process using the photoresist pattern as an etch mask is then performed to etch the pad nitride film, 12, the oxide film 11 and the semiconductor substrate 10, thus forming trenches 13. Thereby, the trenches 13 are formed in the cell region Cell, the low voltage region LV and the high voltage region HV. In this time, the trenches 13 are preferably formed in a depth that can secure isolation property so that memory cells and/or transistors are electrically isolated independently one another.

Figure 4:
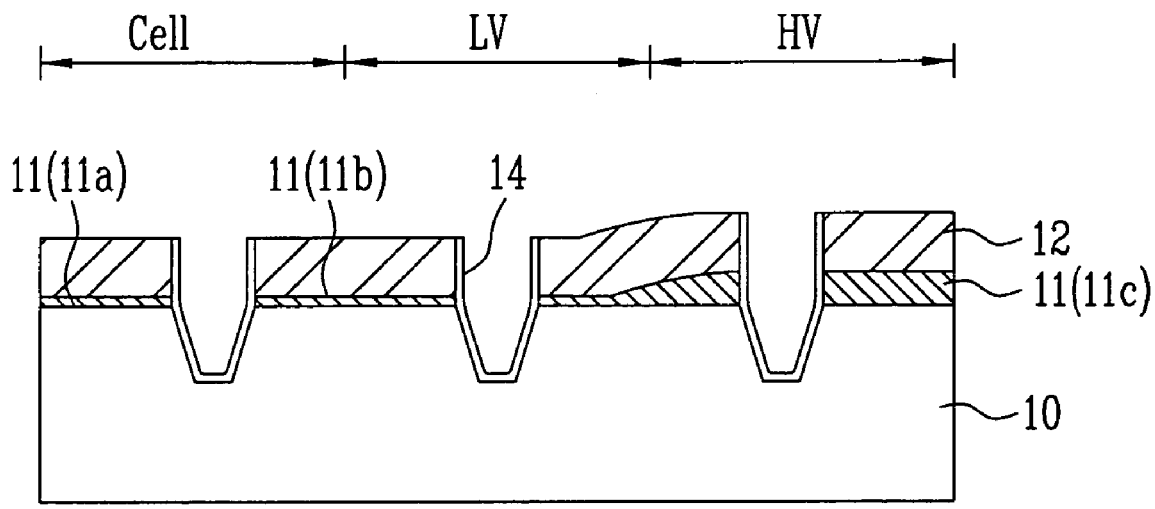

Referring to FIG. 4, wall oxide films 14 are formed in the trenches respectively formed in the cell region Cell, the low voltage region LV and the high voltage region HV, by means of a well oxidization process. In this time, the well oxidization process can be performed as a dry oxidation process so as to compensate the sidewalls of the trenches, which are damaged in the trench formation process. Furthermore, the dry oxidization process can be performed at a temperature ranging from 700° C. to 1000° C. with a deposition target being set to a thickness of 50 Å to 150 Å.

Figure 5:
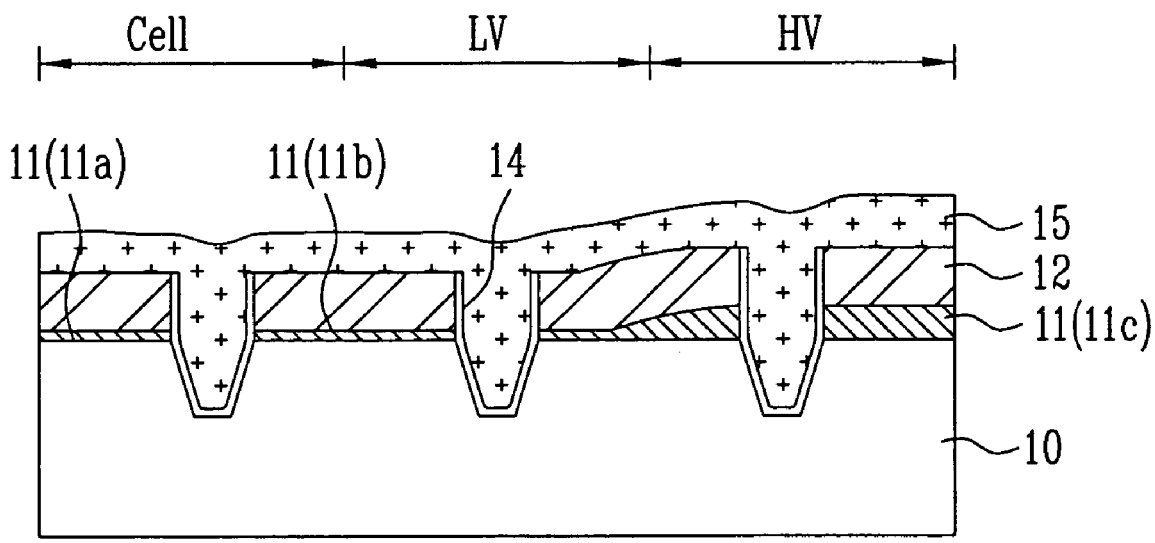

Referring to FIG. 5, an insulating film 15 for an isolation film is formed on the entire surface including the wall oxide films 14. In this time, the insulating film 15 is formed using a HDP (High Density Plasma) oxide film, and is preferably gap-filled so that the void is not generated in the trenches 13. The insulating film 15 can be deposited to a thickness of about 4000' to 10000'.

Figure 6:
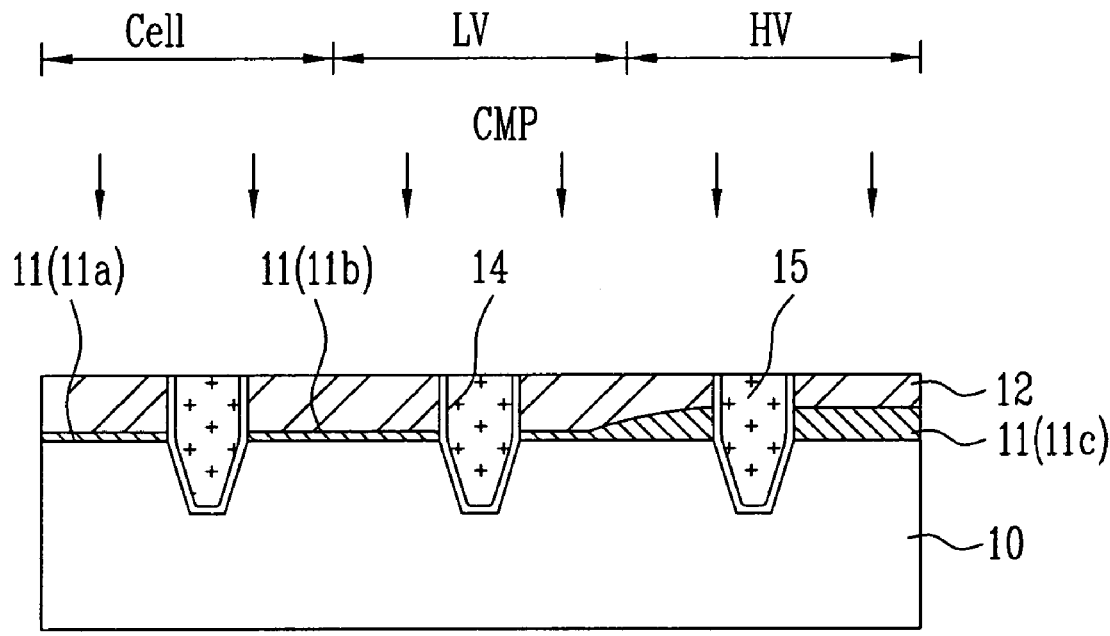

Referring to FIG. 6, a polishing process is performed on the insulating film 15 to polish the entire surface. In this time, the polishing process is performed in a CMP (Chemical Mechanical Polishing) mode, but is performed to control he thickness of the pad nitride film 12 so that the pad nitride film 12 can be recessed in a given thickness.

Figure 7:
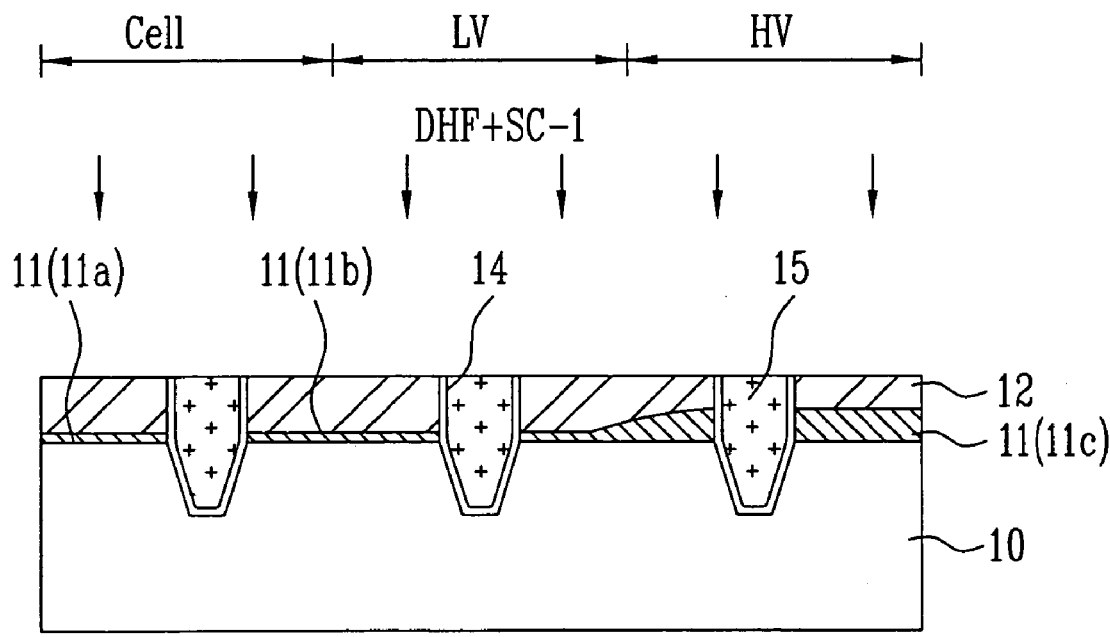

Referring to FIG. 7, a cleaning process is performed on the entire polished surface. The cleaning process can be performed so as to compensate the top surface of the pad nitride film 12 which is damaged in the polishing process or can be performed using DHF and SC-1 so as to remove unnecessary materials, etc. which exist on the surface.

Figure 8:
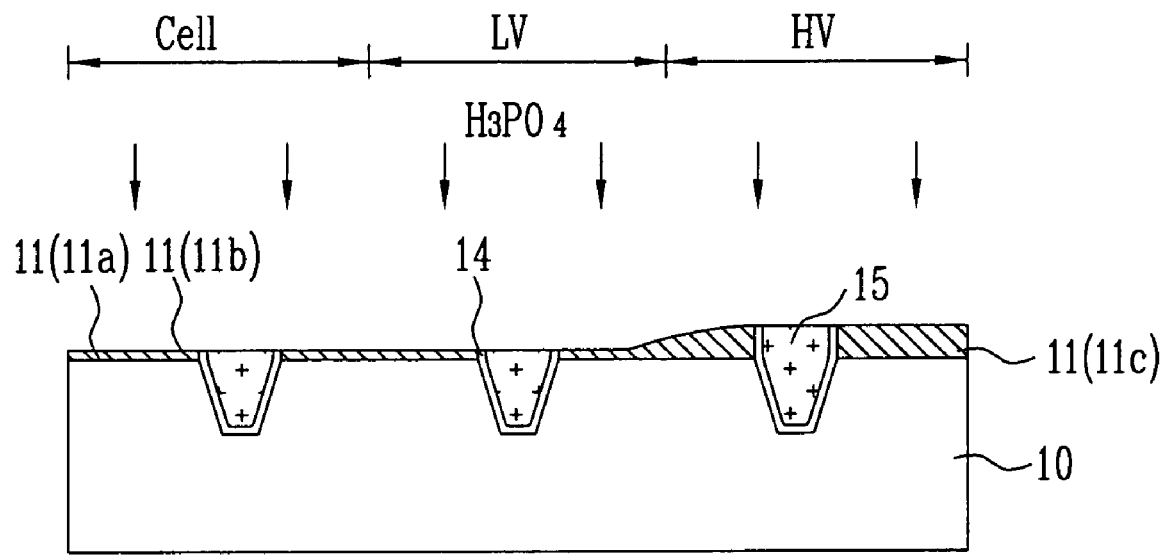

Referring to FIG. 8, an etching process using phosphoric acid ($H_3PO_4$) is performed to completely remove the pad nitride film 12 that remains after the polishing process. In this time, the etching process is preferably performed using the oxide film 11 as an etch-stop layer so that the semiconductor substrate 10 is not damaged. Thereafter, in order to control EFT (Effective Field Thickness) of the insulating film 15 to a thickness of about 50 Å to 150 Å, a cleaning process using DHF and SC-1 can be further carried out.

Figure 9:
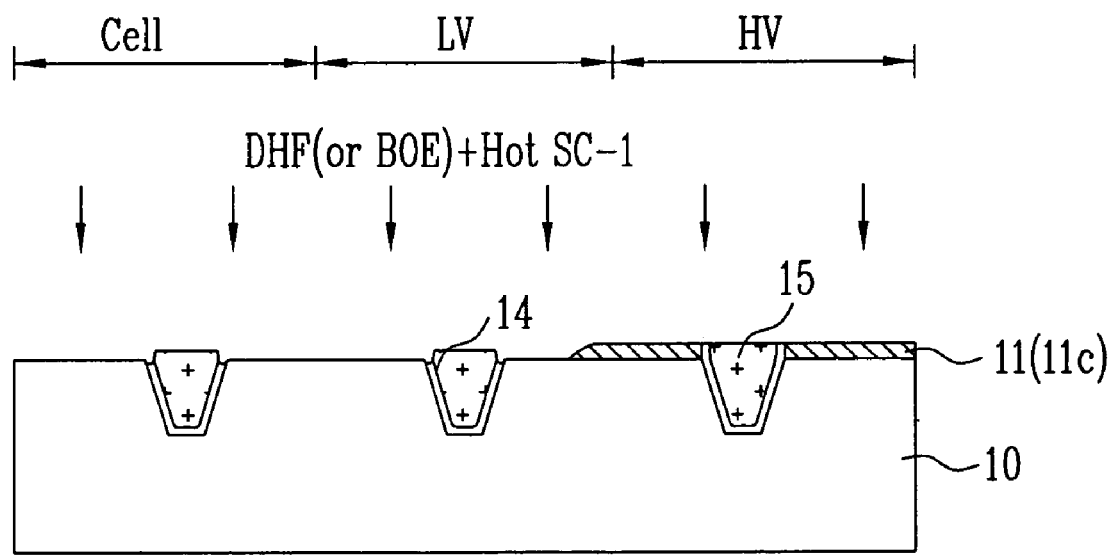

Referring to FIG. 9, while the oxide films 11a and 11b in the cell region Cell and the low voltage region LV are stripped, a cleaning process is performed so as to recess the oxide film 11c of the high voltage region HV to a given thickness. In this time, the cleaning process can be performed using a HF solution (or BOE) in which DHF (Diluted HF) and $H_2O$ are mixed in the ratio of 50:1 and hot SC-1. For example, if the cleaning process is carried out with the recess target of the high voltage gate oxide film 11c being set to 60', the cleaning process is preferably performed using DHF for 25 to 35 seconds, preferably 30 seconds and then performed using SC-1 at a temperature of 60° C. to 70° C., preferably at a temperature of 65° C. for 1 to 11 minutes, preferably 10 minutes. That is, according to the above-described process condition, in the cleaning process using DHF (hereinafter, referred to as "DHF cleaning process"), the recessed thickness is 30 Å and in the cleaning process using hot SC-1 (hereinafter, referred to as "SC-1 cleaning process"), the recessed thickness becomes 30'. In the process condition, the cleaning time can vary depending on the recess target. Preferably, the DHF cleaning process is performed during the time when the high voltage gate oxide film 11c is recessed about ½ to ¾ of the entire recess target of the entire cleaning process (including the DHF cleaning process and the SC-1 cleaning process). The SC-1 cleaning process is performed during the time when the high voltage gate oxide film 11c is recessed about ¼ to ½ of the entire recess target. For instance, if the entire recess target is 60 Å to 100 Å in thickness, the DHF cleaning process is performed within approximately 30 seconds to 100 seconds.

The isolation film is formed through the processes of FIG. 1 to FIG. 9. Next, a tunnel oxide film is formed in the cell region Cell, a low voltage gate oxide film is formed in the low voltage region LV and a high voltage gate oxide film is formed in the high voltage region HVD, by means of an oxidization process. Subsequent processes are the same as the common processes; thus, the description on them will be omitted for the sake of simplicity.

As described above, in the method for forming the isolation film of the semiconductor memory device according to a preferred embodiment of the present invention, the SC-1 cleaning process is performed at a temperature ranging from 60° C. to 70° C. This is for shortening the DHF cleaning time, which has a great influence on generation of moat. If the SC-1 cleaning process is carried out within the temperature of 60° C. to 70° C., recess for the oxide film is performed. However, if the SC-1 cleaning process is performed at normal temperature (approximately 25° C.), recess for the oxide film rarely occurs. This is because a thickness that is finally recessed is determined by the DHF cleaning process in the cleaning process using DHF and SC-1. Accordingly, the DHF cleaning time is increased that much. For example, if a final recess target is set to 60 Å, the DHF cleaning time is about 60 seconds when the SC-1 cleaning process is performed at normal temperature. That is, this is almost two times compared to that of a preferred embodiment of the present invention. Accordingly, if the preferred embodiment of the present invention is applied, the depth of the entire moat can be controlled to be less than 50 Å while minimizing loss of the silicon substrate 10 (approximately less than 50 Å).

Some of the description has been simplified for the sake of convenience. However, those having ordinary skill in the art can implement the isolation film of the semiconductor memory device according to a preferred embodiment of the present invention through the above-described method for forming the isolation film. Furthermore, although the foregoing description has been made with reference to the preferred embodiments, it is to be understood that changes and modifications of the present invention may be made by the ordinary skilled in the art without departing from the spirit and scope of the present invention and appended claims.

As described above, according to the present invention, in the pre-treatment cleaning process performed before the tunnel oxide film is formed, the SC-1 cleaning process is performed at a temperature ranging from 60° C. to 70° C. Therefore, the oxide films in the cell region and the peripheral region are recessed even in the SC-1 cleaning process as well as the DHF cleaning process. The DHF cleaning time can be thus reduced. Accordingly, the present invention has advantages in that it can minimize loss of the silicon substrate by DHF and can thus control the depth of a moat.

What is claimed is:

1. A method for forming an isolation film, comprising the steps of:
   providing a semiconductor substrate in which a pad oxide film is formed;
   depositing a pad nitride film on the pad oxide film;
   etching the pad nitride film, the pad oxide film and a portion of the semiconductor substrate to form trenches;
   depositing an insulating film to bury the trenches;
   polishing the insulating film;
   stripping the pad nitride film; and,
   performing a cleaning process using a diluted HF (DHF) or Buffered Oxide Etchant (BOE) and a Standard Clean-1 (SC-1) cleaning process to strip the pad oxide film, wherein the SC-1 cleaning process is performed at a temperature where the pad oxide film is recessed.

2. The method of claim 1, further comprising performing the SC-1 cleaning process at a temperature ranging from 60° C. to 70° C.

3. The method of claim 1, further comprising performing the DHF cleaning process, wherein the DHF is a HF solution in which $H_2O$ is diluted in the ratio of 50:1.

4. The method of claim 1, further comprising performing the DHF cleaning process while the pad oxide film formed in a high voltage region of the semiconductor substrate is recessed ½ to ¾ of the entire etch target of the pre-treatment cleaning process.

5. The method of claim 4, further comprising performing the DHF cleaning process, wherein DHF is a HF solution in which $H_2O$ is diluted in the ratio of 50:1.

6. The method of claim 1, further comprising performing the DHF cleaning process for 30 to 100 seconds.

7. The method of claim 6, further comprising performing the DHF cleaning process, wherein DHF is a HF solution in which $H_2O$ is diluted in the ratio of 50:1.

8. The method of claim 1, further comprising performing the SC-1 cleaning process while the pad oxide film formed in a high voltage region of the semiconductor substrate is recessed ¼ to ½ of the entire etch target of the pre-treatment cleaning process.

9. The method of claim 1, further comprising performing the SC-1 cleaning process for 1 to 10 minutes.

10. The method of claim 1, wherein the pad oxide film is formed more thickly in a high voltage region of a peripheral region than in a cell region of the semiconductor substrate.

11. The method of claim 10, wherein the pad oxide film formed in the high voltage region is recessed to a given thickness by a pre-treatment cleaning process but a given thickness of the pad oxide film remains intact.

12. The method of claim 1, further comprising the step of performing the DHF cleaning process and the SC-1 cleaning process for the entire polished surface, after polishing the insulating film.

13. The method of claim 1, further comprising the step of performing the DHF cleaning process and the SC-1 cleaning process for the entire surface from which the pad nitride film is stripped, after stripping the pad nitride film.

14. A method for forming an isolation film, comprising:
   forming a pad oxide film over a cell region, a low voltage region and a high voltage region in a semiconductor substrate;
   forming a pad nitride film over the pad oxide film;
   forming trenches by etching the pad nitride film, the pad oxide film and the semiconductor substrate selectively;
   forming an insulating film to bury the trenches;
   polishing the insulating film;
   removing the pad nitride film; and
   performing a first cleaning process using a Diluted HF (DHF) or Buffered Oxide Etchant (BOE) and a second cleaning process using a Standard Clean-1(SC-1) cleaning process to remove the pad oxide film over the cell region and low voltage region and to recess the pad oxide film over the high voltage region.

15. The method of claim 14, comprising performing the SC-1 cleaning process at a temperature ranging from 60° C. to 70° C.

16. The method of claim 14, comprising performing the cleaning process using the DHF using a HF solution in which $H_2O$ is diluted in the ratio of 50:1 for 30 to 100 seconds.

17. The method of claim 14, comprising performing the cleaning process using the DHF while the pad oxide film formed in the high voltage region is recessed ½ to ¾ of the entire etch target.

18. The method of claim 14, comprising performing the cleaning process using the DHF.

19. The method of claim 14, comprising performing the SC-1 cleaning process is while the pad oxide film formed in the high voltage region is recessed ¼ to ½ of the entire etch target.

20. The method of claim 14, further comprising performing a cleaning process using a DHF and SC-1 to control a thickness of the insulating film after removing the pad nitride film.

* * * * *